United States Patent
Kimura et al.

(10) Patent No.: US 9,495,494 B2
(45) Date of Patent: Nov. 15, 2016

(54) CIRCUIT SIMULATING METHOD, CIRCUIT SIMULATING APPARATUS, AND METHOD OF MANUFACTURING SEMICONDUCTOR DEVICE

(71) Applicant: Kabushiki Kaisha Toshiba, Minato-ku, Tokyo (JP)

(72) Inventors: Tomohisa Kimura, Nakano Tokyo (JP); Kazuhide Abe, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 14/645,309

(22) Filed: Mar. 11, 2015

(65) Prior Publication Data
US 2016/0070836 A1     Mar. 10, 2016

(30) Foreign Application Priority Data

Sep. 9, 2014   (JP) ................... 2014-183613

(51) Int. Cl.
*G06F 17/50*    (2006.01)
(52) U.S. Cl.
CPC ....... *G06F 17/5036* (2013.01); *G06F 17/5045* (2013.01)
(58) Field of Classification Search
CPC .............. G06F 17/5036; G06F 17/5045
USPC ........................ 716/100, 101, 106
See application file for complete search history.

(56) References Cited

U.S. PATENT DOCUMENTS

| 6,047,247 | A  | 4/2000  | Iwanishi et al. |
|-----------|----|---------|------------------|
| 6,396,307 | B1 | 5/2002  | Kawakami et al. |
| 6,498,515 | B2 | 12/2002 | Kawakami et al. |
| 6,629,295 | B1 | 9/2003  | Akimoto et al.  |
| 6,634,015 | B2 | 10/2003 | Lee et al.      |
| 6,795,802 | B2 | 9/2004  | Yonezawa et al. |
| 6,810,509 | B2 | 10/2004 | Murakami        |
| 6,869,808 | B2 | 3/2005  | Yonezawa et al. |
| 8,271,254 | B2 | 9/2012  | Kinoshita et al. |
| 2001/0029600 | A1 | 10/2001 | Lee et al.   |
| 2001/0032329 | A1 | 10/2001 | Lee et al.   |
| 2002/0022949 | A1 | 2/2002  | Yonezawa et al. |
| 2002/0140460 | A1 | 10/2002 | Kawakami et al. |

(Continued)

FOREIGN PATENT DOCUMENTS

| JP | 06-168293 A | 6/1994  |
|----|-------------|---------|
| JP | 08-263540 A | 10/1996 |

(Continued)

OTHER PUBLICATIONS

S. S. Burnette et al., "Thermal Re-Emission of Trapped Hot Electrons in NMOS Transistor", IEEE Trans. Electron Devices vol. 38 No. 12 (Dec. 1991).

(Continued)

*Primary Examiner* — Sun Lin
(74) *Attorney, Agent, or Firm* — White & Case LLP

(57) ABSTRACT

The circuit simulating method according to an embodiment includes obtaining a first electrical characteristic value of a circuit element that operates under a predetermined operational condition. The circuit simulating method includes correcting the first electrical characteristic value based on a period in which application of an electrical stress equal to or higher than a reference value is stopped during operation of the circuit element.

20 Claims, 3 Drawing Sheets

(56) References Cited

U.S. PATENT DOCUMENTS

| | | |
|---|---|---|
| 2003/0054577 A1 | 3/2003 | Yonezawa et al. |
| 2003/0188277 A1 | 10/2003 | Murakami |
| 2008/0027700 A1 | 1/2008 | Kinoshita et al. |
| 2008/0126064 A1 | 5/2008 | Tseng et al. |

FOREIGN PATENT DOCUMENTS

| | | |
|---|---|---|
| JP | H09-292436 A | 11/1997 |
| JP | H10-228497 A | 8/1998 |
| JP | 2000-011027 A | 1/2000 |
| JP | 2000-339356 A | 12/2000 |
| JP | 2001-036020 A | 2/2001 |
| JP | 2001-284457 A | 10/2001 |
| JP | 2001-331545 A | 11/2001 |
| JP | 2003-043115 A | 2/2003 |
| JP | 2003-150663 A | 5/2003 |
| JP | 2003-188184 | 7/2003 |
| JP | 2005-100458 A | 4/2005 |
| JP | 2007-257524 A | 10/2007 |
| JP | 2008-042161 A | 2/2008 |
| JP | 2008-053692 A | 3/2008 |
| JP | 2008-225961 A | 9/2008 |

OTHER PUBLICATIONS

Z. J. Ma et al., "Oxide-Trap-Induced Instability in GIDL of Thermally Nitride-Oxide N-MOSFET's Under Stress", IEEE Electron Device Letters, vol. 13, No. 2 (Feb. 1992).

Z. J. Ma et al., "Off-State Instabilities in Thermally Nitride-Oxide n-MOSFET's", IEEE Transations on Electronic Devices, vol. 40, No. 1 (Jan. 1993).

Sanjay V. Kumar et al., "Impact on NBTI on SRAM Read Stability and Design for Reliability", ISQED (2006).

K. Ramakrishnan et al., "Impact of NBTI on FPGAs", VLSID (2007).

T. Grasser et al., "Simultaneous Extraction of Recoverable and Permanent Components Contributing to Bias-Temperature Instability", IEDM (2007).

Hiroaki Konoura et al., "Comparative study on delay degrading estimation due to NBTI with circuit/instance/transistor-level stress probability consideration", ISQED (2010).

$V = \Delta V_{th}$

CIRCUIT SIMULATING METHOD, CIRCUIT SIMULATING APPARATUS, AND METHOD OF MANUFACTURING SEMICONDUCTOR DEVICE

CROSS-REFERENCE TO RELATED APPLICATION

This application is based upon and claims the benefit of priority from the prior Japanese Patent Application No. 2014-183613, filed on Sep. 9, 2014, the entire contents of which are incorporated herein by reference.

FIELD

Embodiments described herein relate generally to a circuit simulating method, a circuit simulating apparatus, and a method of manufacturing a semiconductor device.

BACKGROUND

Conventionally, a circuit that meets a required specification is designed using a circuit simulator by digitizing connection information about the circuit and checking whether or not the resulting data meets the required specification.

A circuit element forming the actual circuit varies in characteristics with time during operation, unlike an ideal model of the circuit element obtained by simulation. Such a circuit element having variable characteristics can disable, or cause malfunction of, a system that incorporates the circuit element.

To prevent the disabling or malfunction of the system, it is effective to perform a simulation that takes into consideration the degradation of the circuit element with time when designing the circuit. In actual, some commercially available circuit simulators incorporate a tool that modifies a circuit element model to allow for the aging degradation of the characteristics of the circuit element.

However, conventional circuit simulators have a problem that they cannot always design a circuit that reflects the aging degradation of the electrical characteristics of the actual circuit element.

DETAILED DESCRIPTION

A circuit simulating method according to an embodiment includes obtaining a first electrical characteristic value of a circuit element that operates under a predetermined operational condition. The circuit simulating method includes correcting the first electrical characteristic value based on a period in which an electrical stress equal to or higher than a reference value is turned off during operation of the circuit element.

In the following, an embodiment will be described with reference to the drawings. The embodiment described below is only an example and does not limit the present invention in any way. The inventor has noticed that the aging degradation of electrical characteristics may decrease (that is, the electrical characteristics tends to recover) when an electrical stress to a circuit element is turned off, and has invented a circuit simulating method, a circuit simulating apparatus and a method of manufacturing a semiconductor device such as those according to this embodiment. Such circuit characteristics that decrease the aging degradation of the electrical characteristics when an electrical stress is turned off is referred to as recovery characteristics. For example, with an MOS transistor, the aging degradation of a threshold voltage decreases with time in a period in which a voltage stress, such as a drain-source voltage or a gate-source voltage, is turned off.

Figure 1:
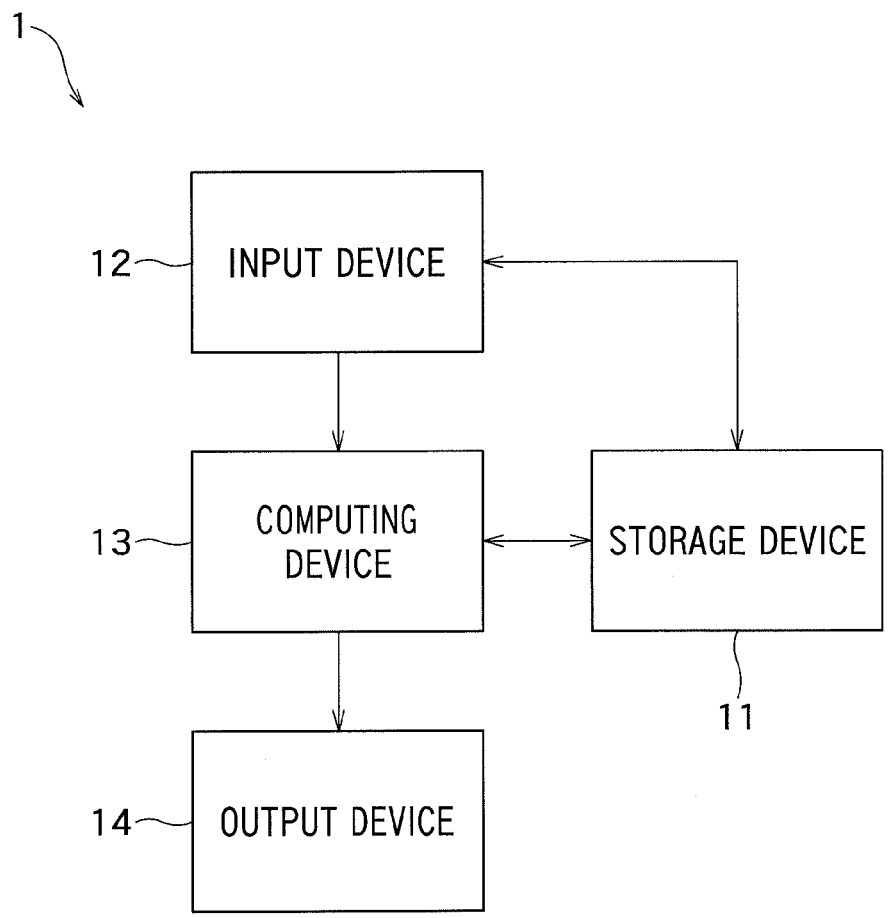
FIG. 1 is a block diagram showing a circuit simulating apparatus 1 according to an embodiment.

FIG. 1 is a block diagram showing a circuit simulating apparatus 1 according to the embodiment. As shown in FIG. 1, the circuit simulating apparatus 1 includes a storage device 11, an input device 12, a computing device 13, and an output device 14.

The storage device 11 is an example of a computer-readable recording medium according to the embodiment. The storage device 11 stores a circuit simulating program. The circuit simulating program is a program that makes a computer perform the procedures (A) and (B) described below.

(A) A first procedure of calculating an intermediate parameter value of a circuit element based on an operational condition of the circuit element that the aging degradation (deterioration) of electrical characteristics decreases when an electrical stress equal to or higher than a reference value is turned off. The intermediate parameter value is a parameter correlated with the aging degradation that increases with time during the period in which the electrical stress equal to or higher than the reference value is applied to the circuit element. Under the operational condition that the electrical stress is turned off, the intermediate parameter value in the first procedure is set so as to decrease with time during the period in which the electrical stress is turned off.

The intermediate parameter value is an example of a first electrical characteristic value. The first electrical characteristic value is not limited to the intermediate parameter value and may be any electrical characteristic value that indicates the recovery characteristics. The first procedure is an example of a procedure of obtaining the first electrical characteristic value when the circuit element whose electrical characteristics vary with time is operating under a predetermined operational condition.

(B) A second procedure of calculating the aging degradation of the electrical characteristics of the circuit element based on the intermediate parameter value calculated in the first procedure.

The second procedure is an example of a procedure of correcting the first electrical characteristic value based on the period in which the electrical stress equal to or higher than the reference value is turned off during operation of the circuit element.

The circuit element is not particularly limited and may be any circuit element that has characteristics that the aging degradation of the electrical characteristics decreases when the electrical stress equal to or higher than the reference value is turned off, that is, the recovery characteristics. A preferred example of the circuit element is an MOS transistor. A more preferred example of the circuit element is a double-diffused MOS (DMOS) transistor. The DMOS transistor is designed to handle a large current and has proved that the aging degradation of the electrical characteristics of the DMOS transistor due to the recovery characteristics is larger than that of other MOS transistors. Therefore, the circuit simulation that takes the recovery characteristics into consideration is more effective for the DMOS transistor.

The electrical stress is a voltage stress or a current stress, for example. The electrical stress equal to or higher than the reference value is an electrical stress equal to or higher than a value that is considered to cause degradation of the electrical characteristics of the circuit element, for example. Specifically, the reference value may be any value that is higher than the value at the time when no electrical stress is applied (that is, zero). The reference value may be a threshold voltage when the electrical stress is the gate-source voltage of an MOS transistor. In that case, turning off the electrical stress equal to or higher than the reference value is equivalent to turning off the MOS transistor.

The aging degradation of the electrical characteristics of the circuit element is the aging degradation $\Delta Vth$ of a threshold voltage of the MOS transistor, the aging degradation $\Delta Idr$ of a current driving capacity of the MOS transistor, or the aging degradation $\Delta Ron$ of an on-resistance of the MOS transistor, for example.

The operational condition of the circuit element is the value of a voltage stress, the value of a current stress, the temperature of the circuit element, or the size of the circuit element, for example.

As defined in the procedure (A), the intermediate parameter value is a parameter from which the aging degradation of the electrical characteristics of the circuit element, that is, a target parameter, can be calculated. However, the intermediate parameter value in this embodiment differs from the normal intermediate parameter value and is a parameter that takes into consideration the recovery characteristics of the circuit element. The intermediate parameter value will be described in further detail later.

The storage device 11 stores not only the circuit simulating program described above but also a circuit simulator that performs a normal circuit simulation based on a net list in a computer-readable manner. The circuit simulating program is incorporated in a circuit simulator as a tool of the circuit simulator, for example. The storage device 11 further stores a circuit diagram editor used for input of a net list in a computer-readable manner.

In response to a user manipulation, the input device 12 creates a net list using the circuit diagram editor read from the storage device 11 and inputs the created net list to the computing device 13. The net list contains not only information required for execution of the normal circuit simulation, such as connection information about circuit elements, but also aging information used to specify the characteristics of the circuit element of which future year is to be analyzed. The input device 12 can be implemented by various types of input user interfaces, computers and displays, for example.

The computing device 13 executes the circuit simulating program read from the storage device 11 to operate as a first calculating part and a second calculating part. That is, the computing device 13 performs the first procedure (A) and the second procedure (B) described above. The computing device 13 outputs to the output device 14 the aging degradation of the electrical characteristics calculated in the second procedure. The computing device 13 can be implemented by a computer. The computing device 13 may share common hardware with the input device 12.

The output device 14 visually outputs the aging degradation of the electrical characteristics received from the computing device 13 as a simulation result. The output device 14 can be implemented by a computer and a display, for example. The output device 14 may share common hardware with the input device 12 and the computing device 13.

Figure 2:
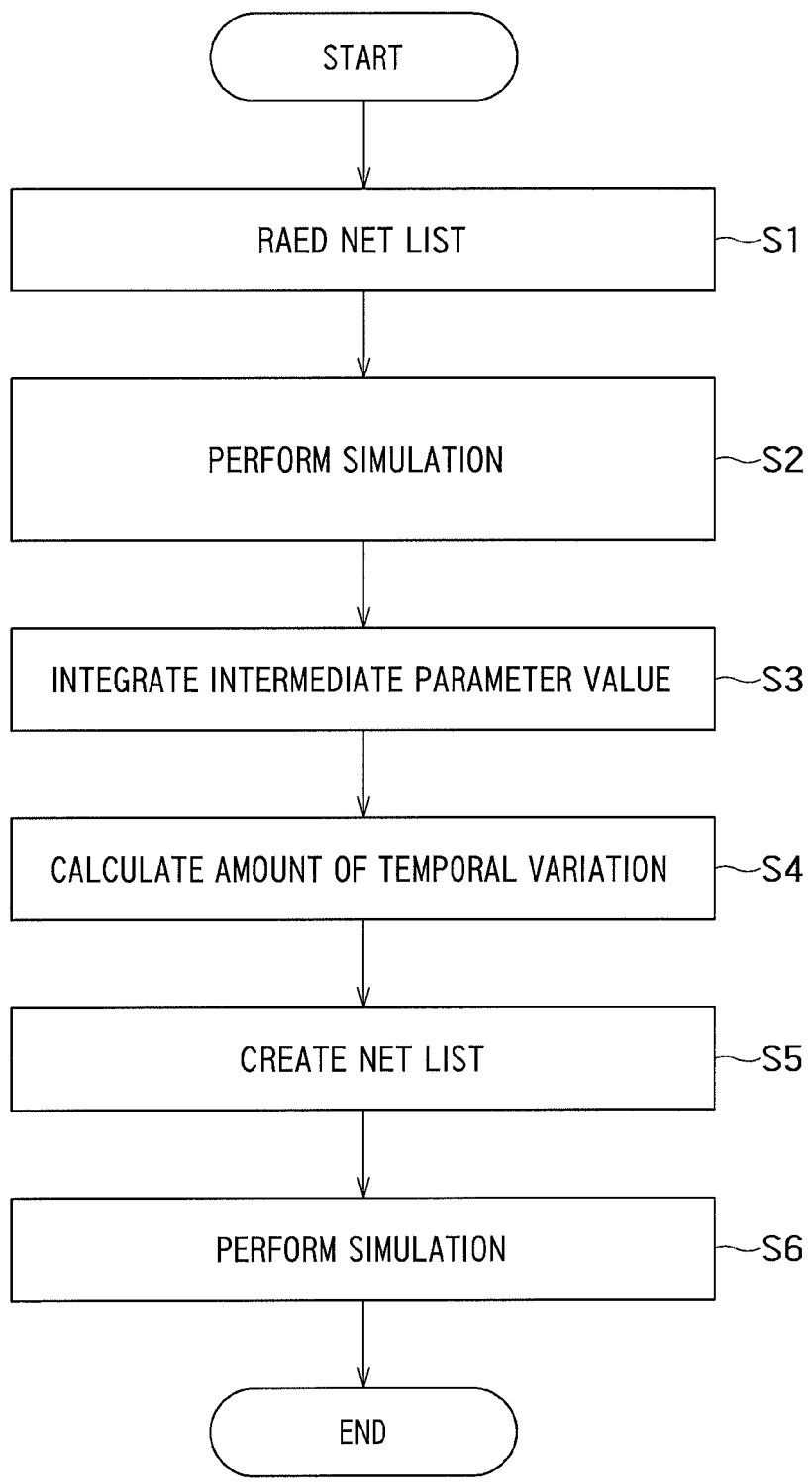
FIG. 2 is a flow chart showing an example of an operation of the circuit simulating apparatus shown in FIG. 1.
Figure 3A:
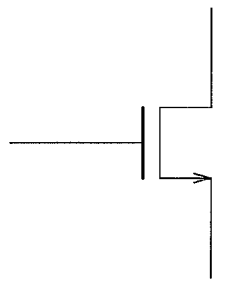
FIG. 3A is a diagram showing an equivalent circuit model of a MOS transistor before degradation of a threshold voltage.
Figure 3B:
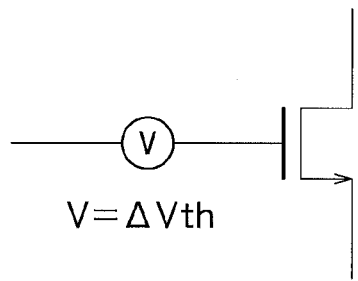
FIG. 3B is a diagram showing an equivalent circuit model of the MOS transistor after degradation of the threshold voltage.
Figure 4:
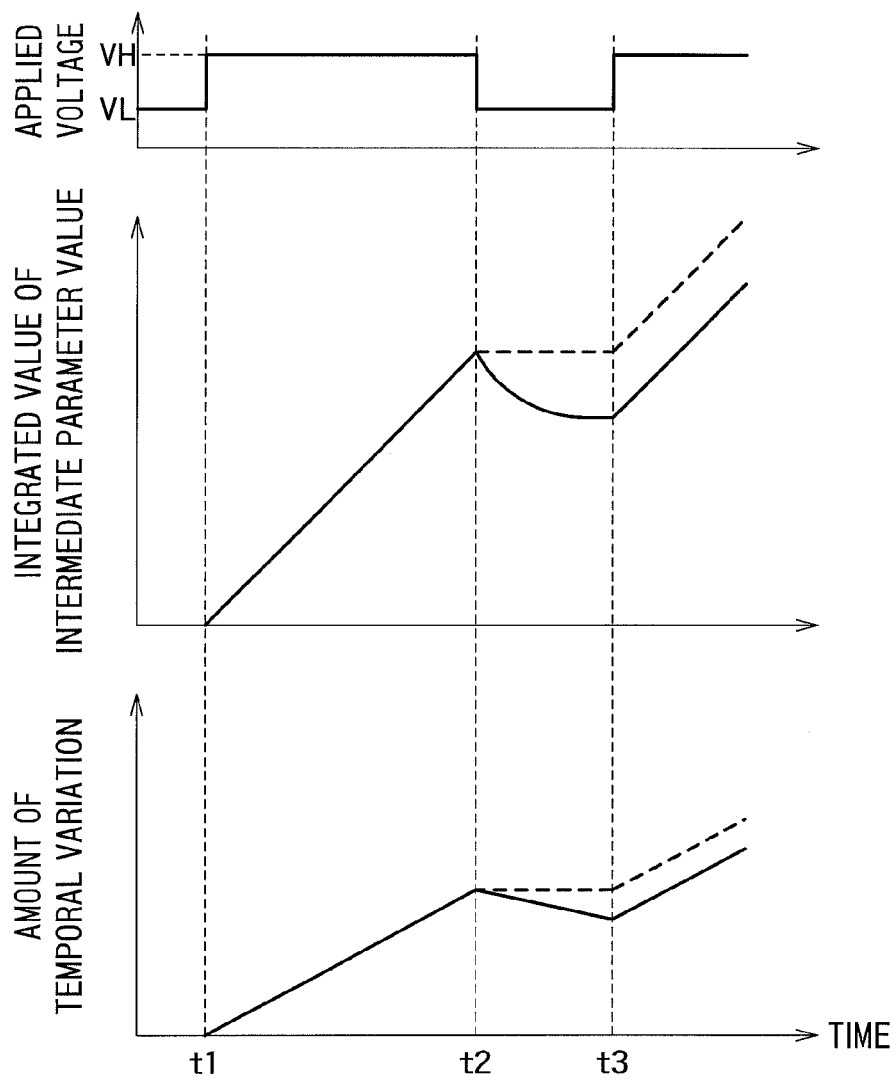
FIG. 4 shows time charts for illustrating an example of an operation of the circuit simulating apparatus shown in FIG. 1.

In the following, an example of an operation of the circuit simulating apparatus 1 shown in FIG. 1 with reference to FIGS. 2 to 4. FIG. 2 is a flow chart showing an example of an operation of the circuit simulating apparatus shown in FIG. 1. FIG. 3 shows schematic diagrams for illustrating an example of an operation of the circuit simulating apparatus shown in FIG. 1. More specifically, FIG. 3A is a diagram showing an equivalent circuit model of a MOS transistor before degradation of a threshold voltage. FIG. 3B is a diagram showing an equivalent circuit model of the MOS transistor after degradation of the threshold voltage. FIG. 4 shows time charts for illustrating an example of an operation of the circuit simulating apparatus shown in FIG. 1.

First, in the first step (S1) in FIG. 2, the computing device 13 executes the circuit simulator read from the storage device 11 to read the net list created by the input device 12 from a storage part for the net list. The storage part for the net list may be a storage area of the input device 12, a storage area of the computing device 13, or a storage area of the storage device 11.

Then, in the second step (S2), the computing device 13 executes the circuit simulator to perform the circuit simulation based on the net list read in the first step (S1).

More specifically, in the second step (S2), the computing device 13 performs a transient analysis. The computing device 13 monitors the voltage (voltage stress) and current (current stress) applied to a terminal of a circuit element, for example, for a certain time specified in the net list. The result of the transient analysis is an operational condition of the circuit element.

In addition, in the second step (S2), the computing device 13 executes the circuit simulating program read from the storage device 11 to calculate an intermediate parameter value based on the operational condition of the circuit element shown by the result of the transient analysis. In calculating the intermediate parameter value, the computing device 13 takes into consideration an attenuation of the intermediate parameter value caused by turning off the stress equal to or higher than a reference value.

In this process, the computing device 13 can solve the operational condition based on the result of the transient analysis as described above. Alternatively, the computing device 13 may solve the operational condition based on an input result of the input device 12 (for example, the result of setting of on/off time of the element).

The intermediate parameter value calculated in the second step (S2) is a corrected integrated quantity obtained by subtracting the amount of decrease caused by turning off the stress equal to or higher than the reference value from a reference integrated quantity obtained by integrating a physical quantity of the circuit element determined by the operational condition over a period from a reference time to a calculation time at which the intermediate parameter value is calculated. The reference time may be a time at which the stress equal to or higher than the reference value to the circuit element is started, although the reference time is not limited to this time.

Examples of the intermediate parameter value defined as the corrected integrated quantity include "Qgate", "Qsub", and "Age" described below, for example.

First, "Qgate" will be described. "Qgate" is a corrected integrated value obtained by subtracting the amount of decrease of the integrated value of a current "Igate" (physical quantity) flowing to a gate of the MOS transistor caused by turning off the voltage stress equal to or higher than the reference value from a reference integrated value obtained by integrating "Igate" over a period from the reference time to the calculation time for "Qgate".

The voltage stress is a gate-source voltage "Vgs" or a drain-source voltage "Vds", for example. The reference value of the voltage stress can be any value below which the current "Igate" does not occur.

The amount of decrease of the integrated value of "Igate" is a value that increases according to an exponential function including a coefficient and a time constant with time during the period of the operational condition that the voltage stress equal to or higher than the reference value is turned off. In this example, "Qgate" decreases (damps) according to the exponential function with time during the period of the operational condition that the voltage stress equal to or higher than the reference value is turned off.

"Qgate" does not exclusively decrease according to the exponential function but may decrease according to a linear function, a quadratic function or a function of higher order.

A second operational condition that the voltage stress equal to or higher than the reference value is applied may occur after the first operational condition that the voltage stress equal to or higher than the reference value is turned off. Under the second operational condition, the amount of decrease of the integrated value of "Igate" with respect to the reference integrated value is a constant value, for example. The constant value is equal to the amount of decrease of the integrated value of "Igate" at the end of the first operational condition, for example.

"Qgate" can be expressed as a function of "Igate" by the following formula.

$$Q\text{gate}=f(I\text{gate},\ldots) \qquad (1)$$

"Qgate" can be used for calculation of the aging degradation $\Delta$Vth of the threshold voltage, for example.

If a parameter "Qgate_a" that assumes the reference integrated value even under the operational condition that the voltage stress equal to or higher than the reference value is turned off is used instead of "Qgate", "Qgate_a" is a constant value under the operational condition that the voltage stress equal to or higher than the reference value is turned off. This is because, in the period in which the voltage stress equal to or higher than the reference value is turned off, "Igate" does not occur, so that the reference integrated value does not increase or decrease.

However, such "Qgate_a" that assumes a constant value does not take into consideration the amount of decrease of the integrated value of "Igate" caused by the recovery characteristics of the MOS transistor. Therefore, $\Delta$Vth obtained based on "Qgate_a" cannot represent the recovery characteristics.

To the contrary, "Qgate" assumes the corrected integrated value that takes into consideration the amount of decrease of the integrated value of "Igate" caused by the recovery characteristics, so that $\Delta$Vth obtained based on "Qgate" can represent the recovery characteristics. This will be described in further detail below.

It is considered that, when the voltage stress is applied, $\Delta$Vth increases with time because a gate oxide of the MOS transistor traps charges. It is also considered that, if the voltage stress is turned off, the charges trapped in the gate oxide are diffused out, and $\Delta$Vth decreases with time, that is, the recovery characteristics is exhibited.

"Qgate" can represent such a charge diffusion behavior as an attenuation of "Qgate", and therefore, $\Delta$Vth obtained based on "Qgate" can appropriately represent the recovery characteristics.

Next, "Qsub" will be described. "Qsub" is a corrected integrated value obtained by subtracting the amount of decrease of the integrated value of a substrate current "Isub" (physical quantity) flowing to a bulk (substrate) node of the MOS transistor caused by turning off the voltage stress equal to or higher than the reference value from a reference integrated value obtained by integrating "Isub" over a period from the reference time to the calculation time for "Qsub".

Specific examples of the voltage stress can be the same as those for "Qgate". Specific examples of the amount of decrease can be the same as those for "Qgate". That is, "Qsub" can decrease according to an exponential function including a coefficient and a time constant with lapse of time during the period of the operational condition that the voltage stress equal to or higher than the reference value is turned off.

"Qsub" can be expressed as a function of "Isub" by the following formula.

$$Q\text{sub}=f(I\text{sub},\ldots) \qquad (2)$$

As with "Qgate", "Qsub" can be used for calculation of the aging degradation $\Delta$Vth of the threshold voltage, for example.

If a parameter "Qsub_a" that assumes the reference integrated value even under the operational condition that the voltage stress equal to or higher than the reference value is turned off is used instead of "Qsub", "Qsub_a" is a constant value under the operational condition that the voltage stress equal to or higher than the reference value is turned off. The reason for this is the same as the reason for "Qgate_a". However, such "Qsub_a" that assumes a constant value does not take into consideration the amount of decrease of the integrated value of "Isub" caused by the recovery characteristics of the MOS transistor. Therefore, $\Delta$Vth obtained based on "Qsub_a" cannot represent the recovery characteristics.

To the contrary, "Qsub" assumes the corrected integrated value that takes into consideration the amount of decrease of the integrated value of "Isub" caused by the recovery characteristics, so that $\Delta$Vth obtained based on "Qsub" can represent the recovery characteristics.

Finally, "Age" will be described. "Age" is a corrected age parameter obtained by subtracting the amount of decrease caused by turning off the voltage stress equal to or higher than the reference value from a reference age parameter expressed as a function (integrated quantity) of at least one (physical quantity) of terminal voltage, temperature and element size and the calculation time at which "Age" is calculated.

Specific examples of the stress can be the same as those for "Qgate". Specific examples of the amount of decrease can be the same as those for "Qgate". That is, "Age" can decrease according to an exponential function including a coefficient and a time constant with time during the period of the operational condition that the voltage stress equal to or higher than the reference value is turned off.

"Age" can be expressed as a function of "Vds", "Vgs", gate width "W", gate length "L", and temperature "Temp" by the following formula.

Age=$f(Vds, Vgs, W, L, \text{Temp}, \ldots)$ (3)

As with "Qgate", "Age" can be used for calculation of the aging degradation ΔVth of the threshold voltage, for example.

If the reference age parameter is used instead of "Age", the reference age parameter can be a constant value under the operational condition that the stress equal to or higher than the reference value is turned off. However, such a reference age parameter that assumes a constant value does not take into consideration the amount of decrease caused by the recovery characteristics of the MOS transistor. Therefore, ΔVth obtained based on the reference age parameter cannot represent the recovery characteristics.

To the contrary, "Age" is the corrected age parameter that takes into consideration the amount of decrease caused by the recovery characteristics, so that ΔVth obtained based on "Age" can represent the recovery characteristics.

Following the second step (S2) described above, the third step (S3) is performed. In the third step (S3), the computing device 13 executes the circuit simulating program to calculate an integrated value of the intermediate parameter value calculated in the second step (S2).

More specifically, in the third step (S3), the computing device 13 calculates the total sum of the intermediate parameter value for the aging time. For example, the computing device 13 may calculates the total sum of the intermediate parameter value for a year of continuous operation of the transient analysis described above.

In calculating the integrated value of the intermediate parameter value, the computing device 13 naturally takes into consideration the attenuation of the intermediate parameter value because the attenuation of the intermediate parameter value is taken into consideration in the second step (S2). However, this embodiment does not exclude an implementation in which the intermediate parameter value is calculated in the second step (S2) without taking the attenuation into consideration, and then the intermediate parameter value is corrected by taking the attenuation into consideration and the corrected intermediate parameter value is integrated in the third step (S3).

Then, in the fourth step (S4), the computing device 13 calculates the aging degradation of the electrical characteristics of the circuit element based on the integrated value of the intermediate parameter value calculated in the third step (S3).

For example, based on the integrated value of "Qgate", the computing device 13 calculates ΔVth that is expressed as a function of "Qgate" and time "T" according to the following formula.

$\Delta Vth = g(Q\text{gate}, T, \ldots)$ (4)

As another example, based on the integrated value of "Qsub", the computing device 13 calculates ΔVth that is expressed as a function of "Qsub" and time "T" according to the following formula.

$\Delta Vth = g(Q\text{sub}, T, \ldots)$ (5)

As another example, based on the integrated value of "Age", the computing device 13 calculates ΔVth that is expressed as a function of "Age" and time "T" according to the following formula.

$\Delta Vth = g(\text{Age}, T, \ldots)$ (6)

The computing device 13 outputs the calculated aging degradation of the electrical characteristics to the output device 14. The output device 14 outputs the aging degradation of the electrical characteristics received from the computing device 13 in a manner that the analyzer can readily solve the aging degradation. For example, the output device 14 may display the aging degradation of the electrical characteristics in the form of a text file or on a circuit diagram data screen.

Then, in the fifth step (S5), the computing device 13 creates a net list in such a manner that the electrical characteristics after the aging degradation, that is, after the aging degradation, can be reproduced by the circuit simulator. The computing device 13 stores the created net list in the storage device 11, for example. The way in which the net list represents the electrical characteristics after the aging degradation is not particularly limited. Preferably, however, the electrical characteristics may be represented by a description with a parameter value by the circuit simulator, or may be represented by an additional equivalent circuit model that represents the amount of degradation. For example, to the equivalent circuit model of the MOS transistor before degradation of the threshold voltage shown in FIG. 3A, a voltage source connected in series with the gate of the MOS transistor, which represents the amount of degradation of the threshold voltage, may be added as shown in FIG. 3B.

Then, in the sixth step (S6), the computing device 13 executes the circuit simulator to perform a circuit simulation of the characteristics after aging by using the net list created in the fifth step (S5).

In this way, the characteristics after aging that reflects the recovery characteristics can be checked. If the circuit simulation of the characteristics after aging is performed without taking the recovery characteristics into consideration, the simulation result shows characteristics that are more significantly deteriorated than the actual characteristics. If the circuit is designed based on such a simulation result so that the degradation falls within the allowable limit, circuit elements are inevitably designed to have larger sizes than required in order to allow for the degradation that is more significant than the actual degradation. As a result, the manufacturing cost of the circuit elements unnecessarily increases.

According to this embodiment, however, the circuit simulation of the characteristics can be performed by taking the recovery characteristics into consideration, so that compact circuit elements that allow for the actual degradation can be used, and therefore, the manufacturing cost can be reduced.

Next, an operation of calculating the intermediate parameter value in the third step (S3) and an operation of calculating the integrated value of the intermediate parameter value in the fourth step (S4) described above will be described in further detail with reference to the time charts of FIG. 4.

The upper part of FIG. 4 shows a time chart of the voltage (voltage stress) applied to the circuit element as an example of the operational condition. In this time chart of the applied voltage, a high-level voltage "VH" corresponds to the stress equal to or higher than the reference value, and a low-level voltage "VL" corresponds to the stress lower than the reference value.

Thus, a period from a time "t2" to a time "t3" in which the low-level voltage "VL" is applied that follows a period from a time "t1" to a time "t2" in which the high-level voltage "VH" is applied for the first time corresponds to the period in which the stress equal to or higher than the reference value is turned off.

The middle part of FIG. 4 shows a time chart of the integrated value of the intermediate parameter value calculated in the third step (S3) in FIG. 2. The time chart is temporally aligned with the time chart of the applied voltage shown in the upper part of FIG. 4.

More specifically, in the middle part of FIG. 4, the solid line shows the integrated value of the intermediate parameter value that takes the attenuation of the intermediate parameter value into consideration described with regard to the second step (S2) and the third step (S3) in FIG. 2. In the middle part of FIG. 4, as a comparative example, the dashed line shows the integrated value of the intermediate parameter value that does not take the attenuation of the intermediate parameter value into consideration.

The lower part of FIG. 4 shows a time chart of the aging degradation of the electrical characteristics of the circuit element calculated in the fourth step (S4) in FIG. 2. The time chart is temporally aligned with the time chart of the applied voltage shown in the upper part of FIG. 4 and the time chart of the integrated value of the intermediate parameter value shown in the middle part of FIG. 4.

More specifically, in the lower part of FIG. 4, the solid line shows the aging degradation of the electrical characteristics based on the integrated value of the intermediate parameter value that takes the attenuation of the intermediate parameter value into consideration (shown by the solid line in the middle part of FIG. 4). In the lower part of FIG. 4, as a comparative example, the dashed line shows the aging degradation of the electrical characteristics based on the integrated value of the intermediate parameter value that does not take the attenuation of the intermediate parameter value into consideration (shown by the dashed line in the middle part of FIG. 4).

As shown in the middle part of FIG. 4, in the period from the time "t1" to the time "t2", the integrated value of the intermediate parameter value monotonically increases with time. This means that, in the period from the time "t1" to the time "t2", the intermediate parameter value itself monotonically increases with time.

As shown in the middle part of FIG. 4, in the period from the time "t2" to the time "t3", the integrated value of the intermediate parameter value that takes the attenuation of the intermediate parameter value into consideration (shown by the solid line) damps with time. This means that, in the period from the time "t2" to the time "t3", the intermediate parameter value itself damps with time according to an exponential function including a coefficient and a time constant.

On the other hand, in the period from the time "t2" to the time "t3", the integrated value of the intermediate parameter value that does not take the attenuation of the intermediate parameter value into consideration (shown by the dashed line) is constant. The intermediate parameter value itself is also constant.

As shown in the middle part of FIG. 4, in the period after the time "t3" in which the high-level voltage "VH" is applied again, both the integrated value of the intermediate parameter value that takes the attenuation of the intermediate parameter value into consideration (shown by the solid line) and the integrated value of the intermediate parameter value that does not take the attenuation of the intermediate parameter value into consideration (shown by the dashed line) monotonically increase with time.

However, in the period after the time "t3", the integrated value of the intermediate parameter value that takes the attenuation of the intermediate parameter value into consideration is smaller than the integrated value of the intermediate parameter value that does not take the attenuation of the intermediate parameter value into consideration by a certain amount. This is because, in the period from the time "t2" to the time "t3", the integrated value of the intermediate parameter value that takes the attenuation of the intermediate parameter value into consideration damps, while the integrated value of the intermediate parameter value that does not take the attenuation of the intermediate parameter value into consideration is constant.

The magnitude relationship between the integrated values of the intermediate parameter value in the period after the time "t3" shown in FIG. 4 means that, in the period after the time "t3", the intermediate parameter value that takes the attenuation into consideration can be smaller than the intermediate parameter value that does not take the attenuation into consideration by a certain amount.

As shown in the lower part of FIG. 4, in the period from the time "t2" to the time "t3", the aging degradation based on the integrated value of the intermediate parameter value that takes the attenuation of the intermediate parameter value into consideration (shown by the solid line) decreases with time. The aging degradation properly reflects the recovery characteristics that occur when the applied voltage is set at the low level ("VL") in the period from the time "t2" to the time "t3".

On the other hand, in the period from the time "t2" to the time "t3", the aging degradation based on the integrated value of the intermediate parameter value that does not take the attenuation of the intermediate parameter value into consideration (shown by the dashed line) is constant. The aging degradation does not reflect the recovery characteristics in the period from the time "t2" to the time "t3".

As described above, according to this embodiment, the intermediate parameter value that reflects the recovery characteristics (a first electrical characteristic value) can be calculated, and therefore, a circuit design that reflects the recovery characteristics can be implemented.

According to the above mentioned embodiment, the semiconductor device including the circuit element designed based on the circuit simulating method can be manufactured. The circuit simulating method of the embodiment performs a circuit simulation extremely close to the actual aging degradation of the semiconductor device. Therefore the semiconductor device can be manufactured effectively.

At least a part of the circuit simulating apparatus according to this embodiment may be implemented by hardware or software. When at least a part of the circuit simulating apparatus is implemented by software, a program that describes at least a part of the functionality of the data processing method may be stored in a recording medium, such as a flexible disk or CD-ROM, loaded into a computer and executed by the computer. The recoding medium is not limited to a removable medium, such as a magnetic disk or an optical disk, but may be a fixed recording medium, such as a hard disk drive or a memory. Alternatively, a program that describes at least a part of the functionality of the data processing method may be distributed via a communication line (including radio communication), such as the Internet. Furthermore, the program may be encrypted, modulated or compressed and the encrypted, modulated or compressed program may be distributed via wired or wireless communication, such as the Internet, or stored in a recording medium for distribution.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A circuit simulating method performed by a circuit simulation apparatus, the circuit simulation method comprising:
   obtaining a first electrical characteristic value of a circuit element that operates under a predetermined operational condition; and
   correcting the first electrical characteristic value based on a period in which an electrical stress equal to or higher than a reference value is turned off during operation of the circuit element.

2. The circuit simulating method according to claim 1, wherein the circuit element varies in electrical characteristics with time,
   the correcting the first electrical characteristic value comprises:
   making the first electrical characteristic value recover based on a period in which the electrical stress is turned off after the electrical stress is applied to the circuit element.

3. The circuit simulating method according to claim 1, wherein the first electrical characteristic value includes an intermediate parameter value that increases with time during the period in which the electrical stress is applied to the circuit element,
   the intermediate parameter value is set to decrease with time during the period in which the electrical stress is turned off under an operational condition that the electrical stress is turned off, and
   the correcting the first electrical characteristic value is performing a correction according to the intermediate parameter value.

4. The circuit simulating method according to claim 3, wherein the first electrical characteristic value deteriorates as the intermediate parameter value increases and recovers as the intermediate parameter value decreases.

5. The circuit simulating method according to claim 4, wherein the intermediate parameter value decreases according to an exponential function including a coefficient and a time constant.

6. The circuit simulating method according to claim 3, wherein the intermediate parameter value is a corrected integrated quantity obtained by subtracting an amount of decrease caused by turning off the electrical stress from a reference integrated quantity obtained by integrating a physical quantity of the circuit element determined by the operational condition over a period from a reference time to a calculation time at which the intermediate parameter value is calculated.

7. The circuit simulating method according to claim 6, wherein the circuit element is a metal-oxide-semiconductor (MOS) transistor, and
   the intermediate parameter value includes at least one of:
   a corrected integrated value obtained by subtracting an amount of decrease caused by turning off the electrical stress from a reference integrated value obtained by integrating a current flowing to a gate of the MOS transistor over a period from the reference time to the calculation time,
   a corrected integrated value obtained by subtracting an amount of decrease caused by turning off the electrical stress from a reference integrated value obtained by integrating a substrate current over a period from the reference time to the calculation time, and
   a corrected age parameter obtained by subtracting an amount of decrease caused by turning off the electrical stress from a reference age parameter expressed as a function of the calculation time and at least one of a terminal voltage, a temperature and an element size.

8. The circuit simulating method according to claim 3, wherein the operational condition under that the electrical stress is turned off includes an operational condition under that the circuit element is turned off.

9. The circuit simulating method according to claim 3, wherein an integrated value of the intermediate parameter value is calculated, and
   the integrated value of the intermediate parameter value is set to decrease with time during the period in which the electrical stress is turned off under the operational condition that application of the electrical stress is turned off.

10. The circuit simulating method according to claim 1, wherein the electrical stress includes at least one of a voltage stress and a current stress.

11. A circuit simulating apparatus, comprising:
    a first calculating part that calculates a first electrical characteristic value of a circuit element that operates under a predetermined operational condition,
    wherein the first calculating part obtains data for executing a correction to correct the first electrical characteristic value based on a period in which an electrical stress equal to or higher than a reference value is turned off during operation of the circuit element.

12. The circuit simulating apparatus according to claim 11, wherein the circuit element varies in electrical characteristics with time,
    the correction of the first electrical characteristic value comprises:
    making the first electrical characteristic value recover based on a period in which the electrical stress is turned off after the electrical stress is applied to the circuit element.

13. The circuit simulating apparatus according to claim 11, wherein the first electrical characteristic value includes an intermediate parameter value that increases with time during the period in which the electrical stress is applied to the circuit element,
    the intermediate parameter value is set to decrease with time during the period in which the electrical stress is turned off under an operational condition that the electrical stress is turned off, and
    the correction of the first electrical characteristic value is a correction according to the intermediate parameter value.

14. The circuit simulating apparatus according to claim 13, wherein the first electrical characteristic value deteriorates as the intermediate parameter value increases and recovers as the intermediate parameter value decreases.

15. The circuit simulating apparatus according to claim 14, wherein the intermediate parameter value decreases according to an exponential function including a coefficient and a time constant.

16. The circuit simulating apparatus according to claim 13, wherein the intermediate parameter value is a corrected integrated quantity obtained by subtracting an amount of decrease caused by turning off the electrical stress from a reference integrated quantity obtained by integrating a physical quantity of the circuit element determined by the operational condition over a period from a reference time to a calculation time at which the intermediate parameter value is calculated.

17. The circuit simulating apparatus according to claim 16, wherein the circuit element is a metal-oxide-semiconductor (MOS) transistor, and the intermediate parameter value includes at least one of:
a corrected integrated value obtained by subtracting an amount of decrease caused by turning off the electrical stress from a reference integrated value obtained by integrating a current flowing to a gate of the MOS transistor over a period from the reference time to the calculation time,
a corrected integrated value obtained by subtracting an amount of decrease caused by turning off the electrical stress from a reference integrated value obtained by integrating a substrate current over a period from the reference time to the calculation time, and
a corrected age parameter obtained by subtracting an amount of decrease caused by turning off the electrical stress from a reference age parameter expressed as a function of the calculation time and at least one of a terminal voltage, a temperature and an element size.

18. The circuit simulating apparatus according to claim 13, wherein the operational condition under that the electrical stress is turned off includes an operational condition under that the circuit element is turned off.

19. A method of manufacturing a semiconductor device, comprising:

executing a circuit simulation; and
manufacturing a semiconductor device, wherein the circuit simulation comprises:
obtaining a first electrical characteristic value of a circuit element that operates under a predetermined operational condition; and
correcting the first electrical characteristic value based on a period in which an electrical stress equal to or higher than a reference value is turned off during operation of the circuit element, and
wherein the manufacturing a semiconductor device comprises:
manufacturing the semiconductor device to include the circuit element designed based on the first electrical characteristic value corrected by the circuit simulation.

20. The method of manufacturing a semiconductor device according to claim 19, wherein the first electrical characteristic value includes an intermediate parameter value that increases with time during the period in which the electrical stress is applied to the circuit element,
the intermediate parameter value is set to decrease with time during the period in which the electrical stress is turned off under an operational condition that the electrical stress is turned off, and
the correcting the first electrical characteristic value is performing a correction according to the intermediate parameter value.

* * * * *